US012660560B2

(12) United States Patent
Ackermann et al.

(10) Patent No.: US 12,660,560 B2
(45) Date of Patent: Jun. 16, 2026

(54) COMPONENTS AND APPARATUS FOR IMPROVING UNIFORMITY OF AN EPITAXIAL LAYER

(71) Applicant: Applied Materials, Inc., Santa Clara, CA (US)

(72) Inventors: Thomas Ackermann, Feichten (DE); Laura Esposito, Feldkirchen (DE); Emir Sabanovic, Villach (AT)

(73) Assignee: Applied Materials, Inc., Santa Clara, CA (US)

( * ) Notice: Subject to any disclaimer, the term of this patent is extended or adjusted under 35 U.S.C. 154(b) by 477 days.

(21) Appl. No.: 18/140,365

(22) Filed: Apr. 27, 2023

(65) Prior Publication Data

US 2024/0363378 A1 Oct. 31, 2024

(51) Int. Cl.
| | |
|---|---|
| *C23C 16/458* | (2006.01) |
| *C30B 25/10* | (2006.01) |
| *C30B 25/12* | (2006.01) |
| *H10P 72/10* | (2026.01) |

(52) U.S. Cl.
CPC ........ *H10P 72/123* (2026.01); *C23C 16/4583* (2013.01); *C30B 25/105* (2013.01); *C30B 25/12* (2013.01)

(58) Field of Classification Search
CPC ........... C23C 16/4583; C23C 16/4584; C23C 16/4586; C23C 16/46; C23C 16/481; C30B 25/105; C30B 25/12; H01L 21/67115; H01L 21/67306
See application file for complete search history.

(56) References Cited

U.S. PATENT DOCUMENTS

| | | | |
|---|---|---|---|
| 2003/0119283 A1 | 6/2003 | Ishibashi et al. | |
| 2014/0263268 A1 | 9/2014 | Cong et al. | |
| 2014/0290573 A1* | 10/2014 | Okabe ..................... | C30B 25/12 |
| | | | 118/500 |
| 2019/0127851 A1* | 5/2019 | Lau ..................... | B23K 26/0006 |
| 2019/0229008 A1* | 7/2019 | Rokkam ............. | H10P 72/7612 |
| 2022/0210872 A1* | 6/2022 | Hu ........................... | C30B 25/08 |
| 2023/0066087 A1* | 3/2023 | Vellore ................. | C30B 25/12 |

FOREIGN PATENT DOCUMENTS

| | | |
|---|---|---|
| EP | 1132950 A1 | 9/2001 |

OTHER PUBLICATIONS

International Search Report and Written Opinion for PCT/US2024/017906 dated Jun. 5, 2024.
Korean Office Action for Application No. 10-2025-7034243 dated Mar. 17, 2026.

* cited by examiner

*Primary Examiner* — Jaehwan Oh
(74) *Attorney, Agent, or Firm* — Patterson + Sheridan, LLP

(57) ABSTRACT

Disclosed herein are a shaft for supporting a susceptor within an epitaxial growth apparatus, and an epitaxial growth apparatus having the same. In one example, the shaft for supporting a susceptor within an epitaxial growth apparatus includes a support column, a post, and a plurality of arms. The post is coupled with a support column. The post includes an infrared transmission reducing portion disposed proximately to the susceptor and having a lower transmissivity of infrared radiation than the support column. The plurality of arms extend radially from the support column and are configured to support the susceptor.

19 Claims, 5 Drawing Sheets

COMPONENTS AND APPARATUS FOR IMPROVING UNIFORMITY OF AN EPITAXIAL LAYER

BACKGROUND

Field

The present disclosure relates to components and apparatus for improving uniformity of epitaxial (EPI) layers, and more specifically relates to components and apparatus that include modified surfaces having reduced transmissivity regarding infrared radiation (IR) to control a temperature spread at targeted locations on a semiconductor substrate during the growth of EPI layers.

Description of the Related Art

Epitaxy refers to processes used to grow a thin crystalline layer (known as an EPI layer) on a crystalline substrate. The EPI layer on a semiconductor substrate can improve the electrical characteristics of the surface and make the substrate and the surface suitable for highly complex microprocessors and memory devices.

As many semiconductor devices, such as CMOS and DRAM, have used EPI layers to achieve higher functions, they also demand strict requirements for the quality of epitaxial layers. Highly uniform EPI layers in terms of thickness and resistivity are especially needed for advanced semiconductor devices. However the commercially available equipment to grow EPI layers, such as an atmospheric epitaxial chamber, have faced certain challenges in achieving EPI layers having high uniformity.

Thus, a need exists for an improved design of an EPI equipment to grow EPI layers with high uniformity.

SUMMARY

Disclosed herein are a shaft for supporting a susceptor within an epitaxial growth apparatus, and an epitaxial growth apparatus having the same. In one example, the shaft for supporting a susceptor within an epitaxial growth apparatus includes a support column, a post, and a plurality of arms. The post is coaxially coupled with the support column. The post includes an IR transmission reducing portion, for example, a matte, pebbled, or roughened surface, disposed proximately to the susceptor and having a lower transmissivity of infrared radiation than the remaining portions of the support column. The plurality of arms extend radially from the support column and are configured to support the susceptor.

In another example, the IR transmission reducing portion comprises side surfaces of the post, an attachment having IR transmission reducing surfaces and coupled to the post, a sheath, and a film deposited on the post.

In yet another example, an epitaxial growth apparatus is provided that includes a susceptor configured to support a substrate, an inner shaft supporting the susceptor, a plurality of heating units operable to heat the susceptor and the substrate. The inner shaft includes a post coaxially coupled with a support column. The post includes an IR transmission reducing portion disposed proximately to the susceptor and has a lower transmissivity of infrared radiation than that of the support column. A plurality of arms extend radially from the support column and are configured to support the susceptor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
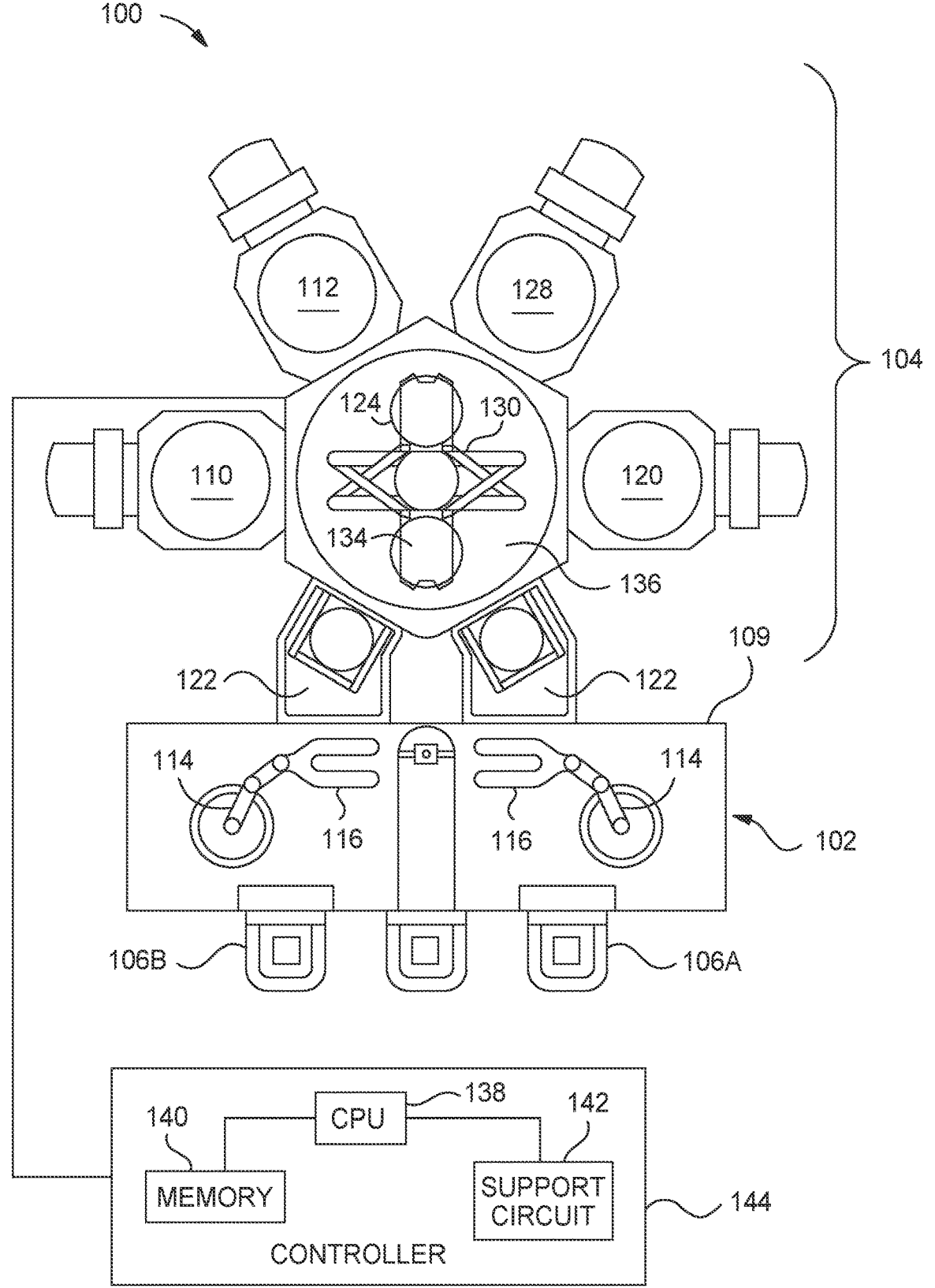
FIG. 1 illustrates a schematic top view of a processing system, according to an embodiment of the present application.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

When a semiconductor substrate is heated in the chamber of an EPI equipment during an EPI growth process, maintaining uniform temperatures across the surface of a semiconductor substrate can be challenging. For example, temperature gradients are often present near the center of the semiconductor substrate. In some processes, the temperature at the center of the semiconductor substrate may be as much as five (5) degrees Celsius higher than the edge of the semiconductor substrate. As temperature is an important factor impacting deposition rate, crystal structure, and doping, this relatively large temperature gradient can cause the central region of the EPI layer to have relatively large variations in terms of thickness and electrical resistivity as compared to the edge.

The disclosure described herein significantly improves the above described temperature variations by shielding the amount of energy directed to the center of the substrate during processing. The amount and location of the shielding may be selected to fine-tune the temperature profile of the concerned areas of a substrate. Conventional EPI chamber parts are typically made of quartz having high purity and highly polished surfaces. Without any treatment, those conventional chamber parts are transparent and have extremely high transmissivity for the infrared radiation used to heat a substrate during the growth process of an EPI layer. Thus, to tune the amount of radiation passing through the chamber parts to the substrate, a portion of the chamber part through which the infrared radiation is directed to the substrate is made less transmissive to the infrared radiation compared to other portions of the chamber part. For example, a highly transmissive chamber part may include a portion having a surface finish which is less transmissive to infrared radiation than another portion of the chamber part. The location of the reduced transmissive portion may be selected to reduce radiant heat received at the central or other area of a substrate. As the reduced transmissive portion, for example a matte surface, has a lower transmissivity for infrared radiation, the amount of heat received by the substrate at targeted regions can be finely controlled, thus improving the uniformity of the EPI layers.

According to a general aspect of the present application, a shaft supporting a susceptor within an epitaxial growth apparatus includes a post coaxially coupled with a support column, wherein the post includes an IR transmission reducing portion disposed proximately to the susceptor and having a lower transmissivity of infrared radiation than that of the support column.

According to various embodiments, an IR transmission reducing portion comprises side surfaces of the post, and the side surfaces of the post include a plurality of non-contiguous IR transmission reducing surfaces each having a different roughness. The entirety of the side surfaces of the post may be IR transmission reducing surfaces. The IR transmission reducing portion may further be disposed on an attachment, the attachment having an IR transmission reducing surface and coupled to the post. The IR transmission reducing surface containing attachment may be configured as a plate, cap, sleeve, or other suitable geometry. In one example, the IR transmission reducing surface containing attachment includes a leg engaging with a bore of the post. The top portion of the attachment may include both an IR transmission reducing surface and a transparent surface, and the transparent surface is disposed at a location that allows a measurement of temperature by a pyrometer disposed within the epitaxial growth apparatus. The IR transmission reducing portion may further include a sheath having IR transmission reducing surfaces or a film deposited on the post. The post may be made of quartz or glass.

According to another general aspect of the present application, an epitaxial growth apparatus includes a susceptor supporting a semiconductor substrate, an inner shaft as described in the application, and a plurality of heating units for heating the susceptor and the semiconductor substrate.

As mentioned above, the IR transmission reducing portion is less transmissive to IR radiation as compared to the bulk of material of the chamber component. In one example, the IR transmission reducing portion includes an IR transmission reducing surface. The IR transmission reducing surface may be a matte, pebbled, or roughened surface suitable for reducing IR transmission compared to other surfaces of the same chamber component.

FIG. 1 illustrates a schematic top view of a processing system 100, according to one or more embodiments. The processing system 100 includes one or more load lock chambers 122 (two are shown in FIG. 1), a processing platform 104, a factory interface 102, and a controller 144. In one or more embodiments, the processing system 100 is a CENTURA® integrated processing system, commercially available from Applied Materials, Inc., located in Santa Clara, California. It is contemplated that other processing systems (including those from other manufacturers) may be adapted to benefit from the disclosure.

The platform 104 includes a plurality of processing chambers 110, 112, 120, 128, and the one or more load lock chambers 122 that are coupled to a transfer chamber 136. The transfer chamber 136 can be maintained under vacuum, or can be maintained at an ambient (e.g., atmospheric) pressure. Two load lock chambers 122 are shown in FIG. 1. The factory interface 102 is coupled to the transfer chamber 136 through the load lock chambers 122.

In one or more embodiments, the factory interface 102 includes at least one docking station 109 and at least one factory interface robot 114 to facilitate the transfer of substrates. The docking station 109 is configured to accept one or more front opening unified pods (FOUPs). Two FOUPS 106A, 106B are shown in the implementation of FIG. 1. The factory interface robot 114 having a blade 116 disposed on one end of the robot 114 is configured to transfer one or more substrates from the FOUPS 106A, 106B, through the load lock chambers 122, to the processing platform 104 for processing. Substrates being transferred can be stored at least temporarily in the load lock chambers 122.

Each of the load lock chambers 122 has a first port interfacing with the factory interface 102 and a second port interfacing with the transfer chamber 136. The load lock chambers 122 are coupled to a pressure control system (not shown) which pumps down and vents the load lock chambers 122 to facilitate passing the substrates between the environment (e.g., vacuum environment or ambient environment, such as atmospheric environment) of the transfer chamber 136 and a substantially ambient (e.g., atmospheric) environment of the factory interface 102.

The transfer chamber 136 has a vacuum robot 130 disposed therein. The vacuum robot 130 has one or more blades 134 (two are shown in FIG. 1) capable of transferring the substrates 124 between the load lock chambers 122 and the processing chambers 110, 112, 120, 128.

The controller 144 is coupled to the processing system 100 and is used to control processes and methods, such as the operations of the methods described herein (for example the operations of the method 1000 and/or the method 1050 described below). The controller 144 includes a central processing unit (CPU) 138, a memory 140 containing instructions, and support circuits 142 for the CPU. The controller 144 controls various items directly, or via other computers and/or controllers.

Figure 2:
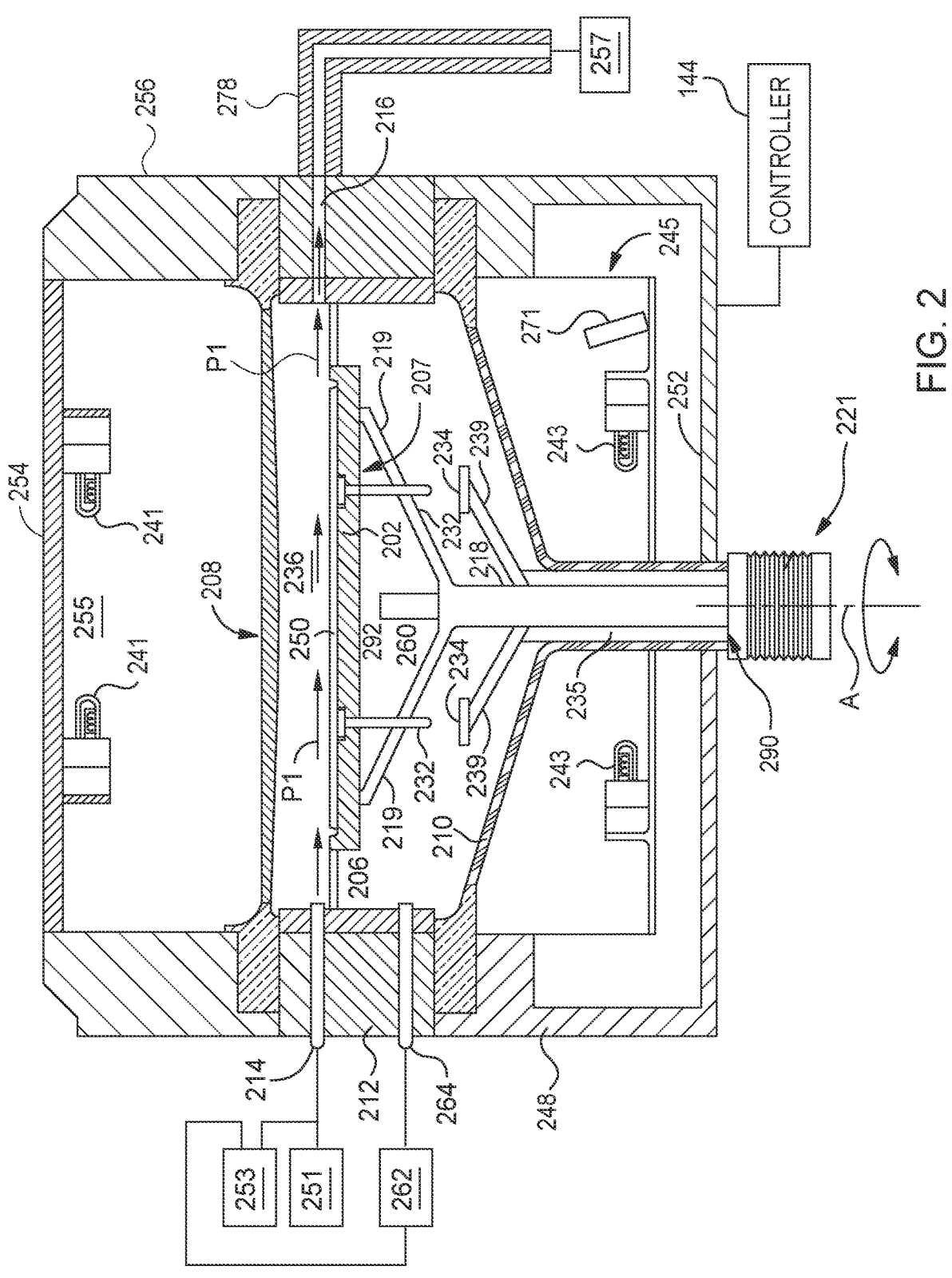
FIG. 2 illustrates a schematic cross-sectional view of an EPI processing chamber, according to an embodiment of the present application.

FIG. 2 illustrates a schematic cross-sectional view of an EPI processing chamber 200 according to an embodiment. The EPI processing chamber 200 is a deposition chamber to grow an EPI layer on a substrate 202. The processing chamber 200 can be used as one or more of the processing chambers 110, 112, 128 shown in FIG. 1. In one or more embodiments, a processing chamber 120 conducts processing (such as pre-cleaning or etching) at a temperature (such as an ambient temperature, for example a room temperature) that is lower than a processing temperature used in the processing chamber 200.

The processing chamber 200 includes an upper body 256, a lower body 248 disposed below the upper body 256, and a flow module 212 disposed between the upper body 256 and the lower body 248. The upper body 256, the flow module 212, and the lower body 248 form a chamber body. Disposed within the chamber body is a susceptor 206, an upper window 208 (such as an upper dome), a lower window 210 (such as a lower dome), a plurality of upper heat sources 241, and a plurality of lower heat sources 243. As shown, the controller 144 is in communication with the processing chamber 200 and is used to control processes and methods of at least the processing chamber 200.

According to an embodiment, the heat sources 241, 243 are lamps that are capable of generating infrared radiation. Other heat sources that are capable of generating infrared radiation are contemplated, such as resistive heaters, light emitting diodes (LEDs), and/or lasers.

The susceptor 206 is disposed between the upper window 208 and the lower window 210. The susceptor 206 supports the substrate 202 and has a plurality of through holes 207. The plurality of upper heat sources 241 are disposed between the upper window 208 and a lid 254. The plurality of upper heat sources 241 form a portion of the upper heating module 255.

The processing chamber 200 includes one or more thermal sensors 271 configured to detect a thermal condition of the processing chamber 200. In one or more embodiments, the one or more thermal sensors 271 may include one or more cameras, one or more pyrometers, one or more thermoelectric sensors, and/or one or more thermal labels. The one or more thermal sensors 271 can be mounted, for example, below the lower window 210 (as shown in FIG. 2), or above the upper window 208 (such as on or in the lid 254), or any other suitable place in the processing chamber 200. According to an embodiment, a pyrometer is mounted below the lower window 210 and is configured to remotely measure temperature of the substrate 202 and the susceptor 206 during the growth process of an EPI layer.

The plurality of lower heat sources 243 are disposed between the lower window 210 and a chamber floor 252. The plurality of lower heat sources 243 form a portion of a lower heating module 245. The upper window 208 is an upper dome and is formed at least partially of an energy transmissive material, such as quartz. The lower window 210 is a lower dome and is formed at least partially of an energy transmissive material, such as quartz.

The susceptor 206 is supported by an inner shaft 218. The inner shaft 218 has a first end 290 and a second end 292. The first end 290 of the inner shaft 218 is connected to a motion assembly 221. The motion assembly 221 includes one or more actuators and/or adjustment devices that provide movement and/or adjustment for the inner shaft 218, which, in turn, moves the susceptor 206 and the substrate 202. The susceptor 206 is coupled to the inner shaft 218 through one or more arms 219 coupled to the inner shaft 218. The arms 219 are coupled to the inner shaft 218 at locations that are closer to the second end 292 relative to the first end 290. The arms 219 extend from the inner shaft 218 toward the susceptor 206 at an acute angle relative to the second end 292. The lift pin holes 207 of the susceptor 206 are each sized to accommodate a lift pin 232 that is used to lift the substrate 202 from the susceptor 206 or lower the same to the susceptor 206. The lift pin stops 234 are disposed on a plurality of arms 239 that are coupled to an outer shaft 235.

According to an embodiment of the present application, the portion of the inner shaft 218 between the arms 219 and the second end 292 of the inner shaft 218 forms a post 260. The location and surface properties of the post 260 are selected such that the post 260 is capable of reducing the amount of infrared radiation to be received by desired regions, such as a central region, of the substrate 202. This is accomplished by configuring a portion of the post 260 to be less transmissive to infrared radiation relative to other portions of the inner shaft 218. Stated differently, a portion of the post 260 is less transmissive to infrared radiation relative to materials generally used to make the inner shaft 218, for example, polished quartz. According to an embodiment, the post 260 is disposed at a location that is proximate to the substrate 202 such that an end of the post 260 is adjacent to the center of the substrate 202. As a result, the amount of radiant heat received at a central region of the substrate 202 can be increased or decreased by the post 260 depending on the properties of the post 260. This is particularly true with regard to the radiant heat generated by the lower heating source 243 because the post 260 is in the direct path between the central region of the substrate 202 and the lower heating source 243. According to an embodiment, the inner shaft 218, the post 260, and the arms 219 are made of quartz. According to another embodiment, the post 260 includes a portion having a modified surface that has transmissivity lower than other portions of the post 260 for the infrared radiation generated by the lower heat sources 243. The modified surface may include matte, pebbled, or roughened surface that reduces the transmissivity of infrared radiation through the bulk material of the post 260, for example, quartz. The modified surfaces may be formed by treating surfaces of the post 260 or coupling an attachment to the post 260. The attachment may be a plate, cap or a sheath. The roughness of the modified surface is adjustable via mechanical or chemical processes to further fine-tune their transmissivity. According to an embodiment of the present application, other portions of the inner shaft 218 or portions of the outer shaft 235 may also be configured to have modified surfaces to reduce IR transmissivity of radiant heat.

The flow module 212 includes a plurality of gas inlets 214, a plurality of purge gas inlets 264, and one or more gas exhaust outlets 216. The gas inlets 214 are connected with a plurality of process gas sources 251, 253 and provides a cross-flow of precursors across a top surface 250 of the substrate 202. The purge gas inlets 264 are connected to a purge gas source 262 and provide purge gas to the EPI chamber 200. The plurality of gas inlets 214 and the plurality of purge gas inlets 264 are disposed on the opposite side of the flow module 212 from the one or more gas exhaust outlets 216. The one or more gas exhaust outlets 216 are connected to or include an exhaust system 278. The exhaust system 278 fluidly connects the one or more gas exhaust outlets 216 and the exhaust pump 257. The exhaust system 278 is disposed on an opposite side of the processing chamber 200 relative to the flow module 212.

Figure 3:
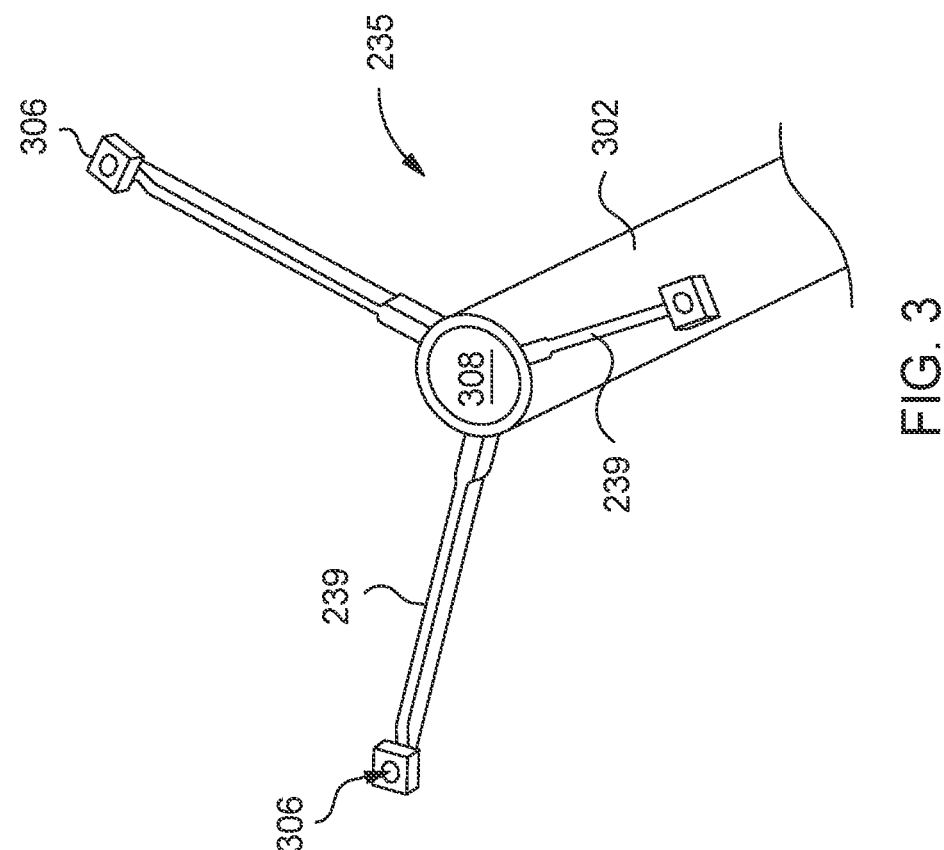
FIG. 3 illustrates a schematic perspective view of an outer shaft of the EPI processing chamber depicted in FIG. 2, according to an embodiment of the present application.

FIG. 3 illustrates a perspective view of the outer shaft 235 in FIG. 2 according to an embodiment of the present application. The outer shaft 235 includes a support column 302 and a plurality of arms 239 that extend radially from the support column 302. The support column 302 is a hollow cylindrical member having a hollow central part 308 that allows the inner shaft 218 to pass through and connect with the motor assembly 221. The arm 239 of the outer shaft 235 includes a pedestal portion 306 coupled to the arm 239. The pedestal portion 306 includes a lift pin stop 234 coupled with the lift pin 232. The outer shaft 235 is coaxial with the inner shaft 218 and can move up and down along a vertical direction to move the lift pin 232, which, in turn, lifts the substrate 202 from the susceptor 206 or lowers the substrate 202 to the susceptor 206. According to an embodiment, the outer shaft 235 is made of quartz and is highly polished and transparent.

Figure 4:
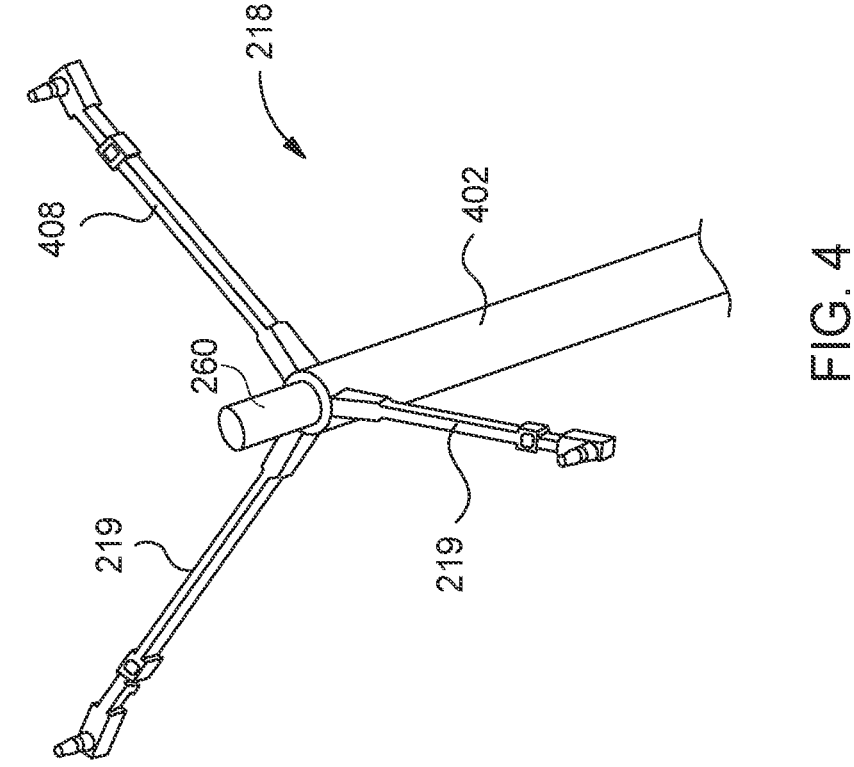
FIG. 4 illustrates a schematic perspective view of an inner shaft of the EPI processing chamber depicted in FIG. 2, according to an embodiment of the present application.

FIG. 4 illustrates a perspective view of the inner shaft 218 in FIG. 2 according to an embodiment of the present application. The inner shaft 218 includes the post 260, a support column 402, and a plurality of arms 219 that extend radially from the support column 402. The post 260 is coupled to the support column 402 and shares a common axis with the support column 402. The arms 219 are provided with through holes 408 which pass through the arms 219 in a vertical direction and allow the lift pins 232 to pass through. According to an embodiment, the inner shaft 218 is made of quartz. The post 260 has a height that occupies a substantial vertical space between the support column 402 and the susceptor 206.

The post 260 is disposed proximately to the susceptor 206 comparing with the support column 402. According to an embodiment, the post 260 is disposed between the arms 219 and the susceptor 206 and have a modified surface that is not highly polished or transparent. The modified surface may have a rough texture, a patterned texture, or a high absorbance. As a result, the modified surface has a translucent appearance and has a reduced transmissivity for the radiant heat generated by the lower heat sources of the processing chamber. According to an embodiment, the heat sources generate infrared radiation, and the modified surface of the post 260 has a reduced transmissivity for the infrared radiation. According to an embodiment, the modified surface includes a matte portion.

As quartz parts used in semiconductor processing are generally highly polished and transparent to infrared radiation, the conventional inner shaft 218, which has not applied surface treatment as the present application, would allow most radiant heat to pass through. The matte portion of the post 260 of the present application is designed to have a surface that can reduce the transmissivity by absorbing or scattering the infrared radiation. As the matte portion is disposed close to the central region of the substrate where a relatively large temperature spread occurs, the post 260 with modified surface can be used to fine-tune the temperature profile of the central region and improve the uniformity of the EPI layer thereof.

The matte portion of the post 260 may be formed by a plurality of methods. According to an embodiment, the matte portion of the post 260 includes a matte surface that is generated by mechanical processing, such as sand-blasting or sanding, or by chemical etching. Both the roughness and the translucency of the matte surface may be varied by adjusting the process parameters. According to an embodiment, the matte surface may be formed as a single contiguous area having the same roughness or translucency. According to another embodiment, the matte surface may be formed by multiple non-contiguous areas each having a different roughness or translucency.

According to another embodiment, the matte portion of the post 260 is formed by coupling an attachment to the post 260. The attachment may be a cap or a sheath that has a matte surface. The attachment may be made of quartz too.

According to yet another embodiment, the matte portion of the post 260 includes a thin film deposited to the surface of the post 260 by any suitable coating method. The film may be made of any material that has a greater ability to absorb the infrared radiation or scatter the same than a polished transparent quartz.

Figure 5B:
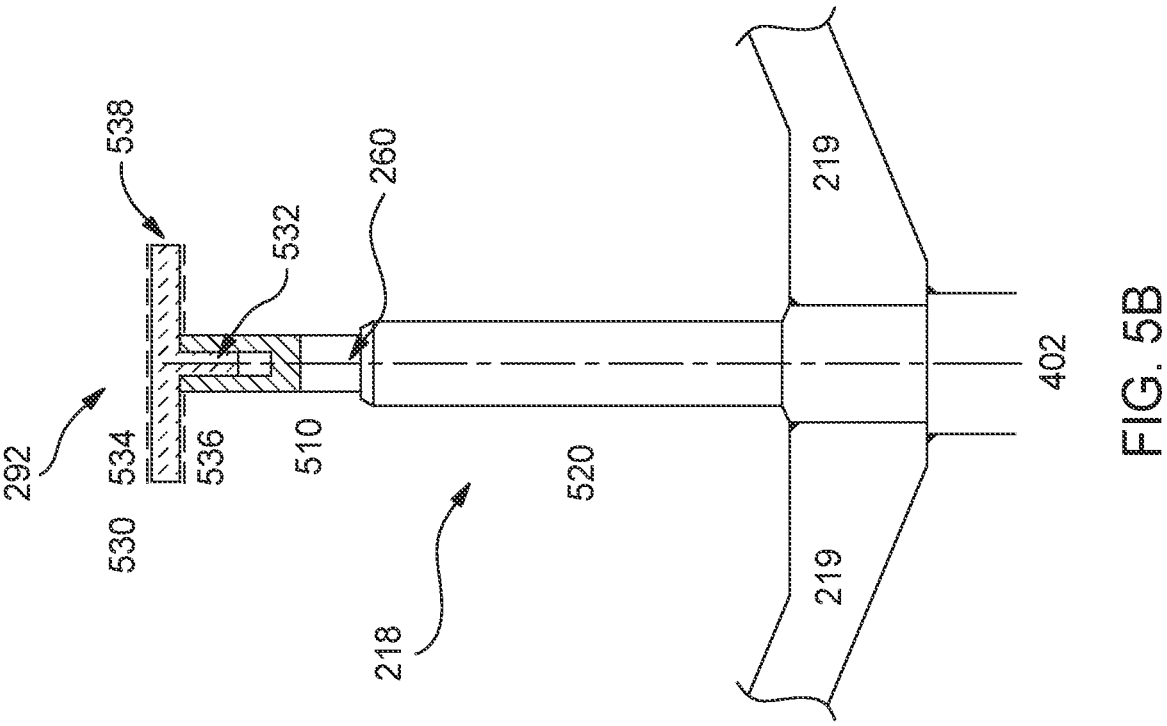
FIG. 5B illustrates the inner shaft interfaced with a plate-shaped attachment having an IR transmission reducing surface, according to an embodiment of the present application.
Figure 5A:
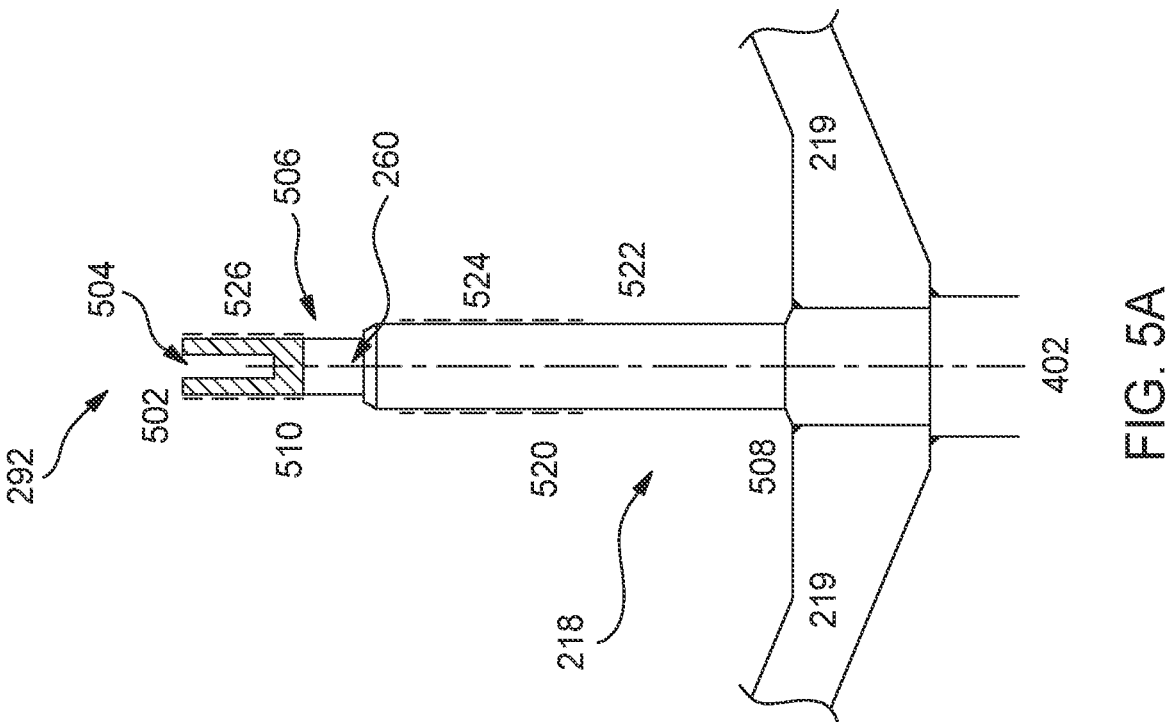
FIG. 5A illustrates the inner shaft having a post with an IR transmission reducing surface according to an embodiment of the present application.

FIG. 5A illustrates a cross-sectional view of the post 260 with a matte surface according to an embodiment of the present application. The post 260 of FIG. 5A is coupled with the support column 402 via a bottom end 508, where the arms 219 radially extend away from the support column 402. The post 260 has a top end 502, an upper portion 510, and a lower portion 520.

The upper portion 510 includes a side surface 506. In one example, at least a portion of the side surface 506 includes an IR transmission reducing surface 526. The IR transmission reducing surface 526 of the side surface 506 may be a matte surface. The matte surface may cover a portion or the entirety of the side surface 506. According to an embodiment, the upper portion 510 further includes a bore 504 as a coupling mechanism for an attachment. The bore 504 may also include an IR transmission reducing surface, such as a matte surface.

The lower portion 520 includes side surface 522. In one example, at least a portion of the side surface 522 includes an IR transmission reducing surface 524 in addition to, or in the alternative of, the IR transmission reducing surface 526 of the side surface 506. According to an embodiment, the matte IR transmission reducing surfaces 524 cover the entire lower portion 520. The IR transmission reducing surface 524 of the side surface 522 may be a matte surface. As shown in FIG. 5A, the IR transmission reducing surfaces 524 of the lower portion 520 and the IR transmission reducing surfaces 526 of the upper portion 510 are not contiguous and separated by a transparent area. The transparent area can be formed by masking the post 260 with a protective film during mechanical or chemical forming of the matte surface. According to an embodiment, each of the surfaces 524 and 526 has a different IR transmissivity. According to yet another embodiment, the IR transmission reducing surfaces 524 of the lower portion 520 and the IR transmission reducing surfaces 526 of the upper portion 510 form a contiguous IR transmission reducing matte surface on the post 260.

As shown in FIG. 5A, the two portions of the post 260 have different diameters, where the upper portion 510 has a smaller diameter than the lower portion 520. According to another embodiment, the upper portion 510 and the lower portion 520 have the same diameter. As shown in FIG. 5A, the lower portion 520 has a smaller diameter than the support column 402. According to another embodiment the lower portion 520 has the same diameter as the support column 402.

FIG. 5B illustrates a cross-sectional view of the post 260 with an attachment 530 having an IR transmission reducing surface according to an embodiment of the present application. The IR transmission reducing surface may be a matte surface. The attachment 530 has a plate-shaped top portion 538 extending in a horizontal direction and a leg 532 extending in a vertical direction. The top portion 538 may be curved, planar, solid, mesh, perforated, or have another suitable geometry. The top portion 538 has a top surface 534 and a bottom surface 536, either or both of which may be IR transmission reducing surfaces, for example, matte surface. The leg 532 couples the attachment 530 to the post 260 via an engagement with the bore 504. Compared to the matte IR transmission reducing surfaces of FIG. 5A that extend mainly along a vertical direction, the attachment 530 allows matte IR transmission reducing surfaces to extend in the horizontal direction, which can cover a larger area and provide more design options. To prevent the attachment 530 from interfering with the functions of other sensors, such as a thermal sensor beneath the attachment 530, the attachment 530 may include both matte surfaces and transparent surfaces, where the matte surfaces are selectively formed at locations to avoid interference with the functions of pyrometers in the lower chamber.

Figure 5D:
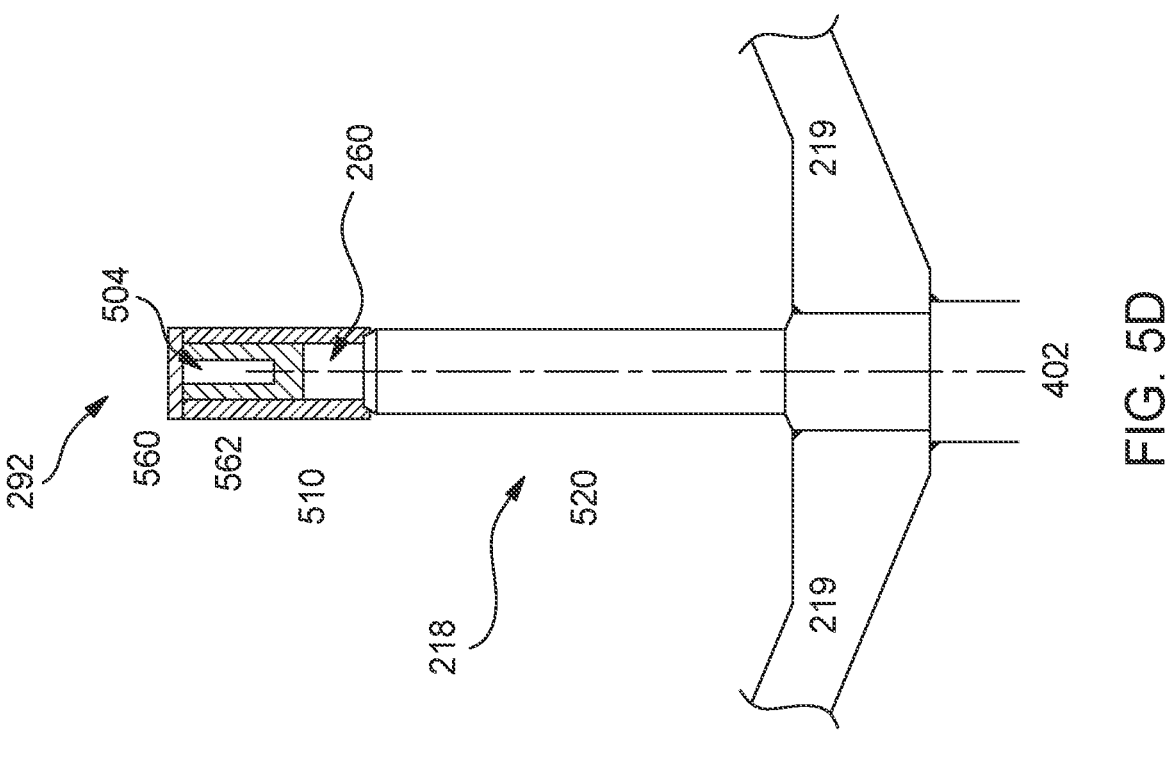
FIG. 5D illustrates the inner shaft interfaced with a cap having an IR transmission reducing surface, according to an embodiment of the present application.
Figure 5C:
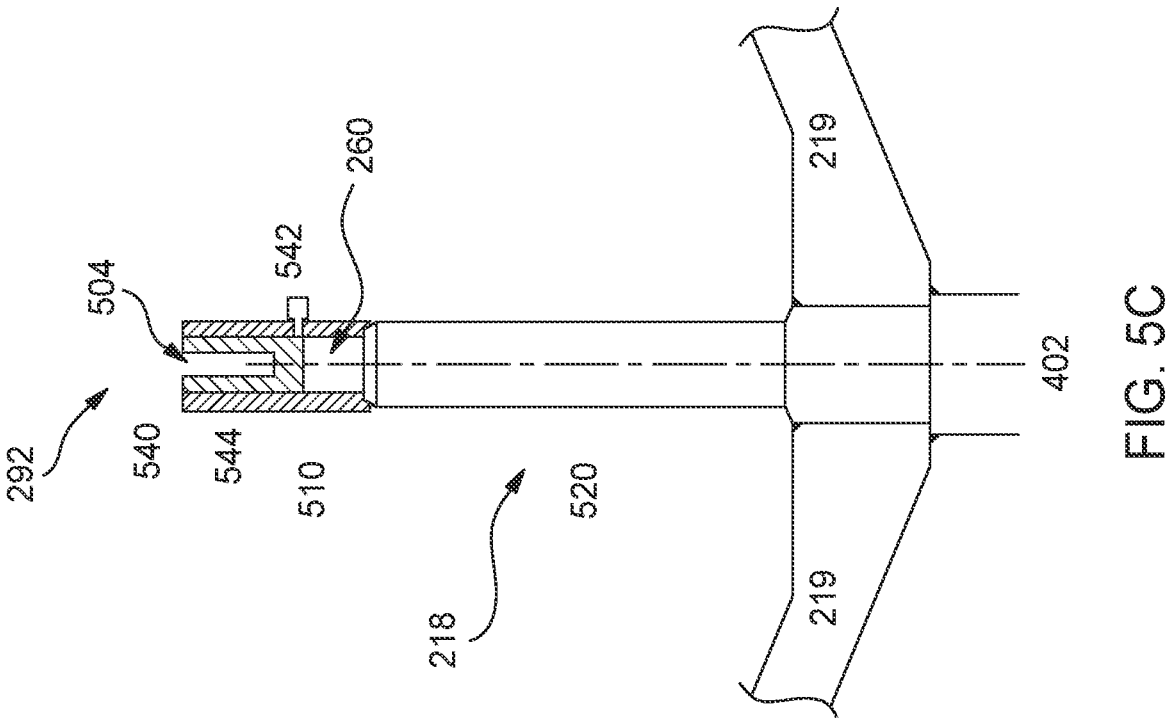
FIG. 5C illustrates the inner shaft interfaced with a sheath having an IR transmission reducing surface, according to an embodiment of the present application.

FIG. 5C illustrates a cross-sectional view of the post 260 with a sheath 540 having an IR transmission reducing surface 544 according to an embodiment of the present application. The sheath 540 has a simpler shape and may be more efficient to manufacture than the plate-shaped attachment 530 shown in FIG. 5B. In addition, the sheath 540 allows other attachments to be coupled with the post 260 via the bore 504. The sheath 540 may cover a portion or the entirety of the post 260. The sheath 540 may have a diameter slightly greater than the upper portion 510 or the lower portion 520 such that it can be snuggly slipped over the post 260. According to an embodiment, a fastening mechanism 542, such as a screw, is additionally included to couple the sheath 540 to the post 260. The sheath 540 includes an internal surface and an external surface, either or both of which may be IR transmission reducing surfaces 544, for example, matte surface. According to an embodiment, the sheath may be formed by a film deposited on the post 260.

FIG. 5D illustrates the inner shaft interfaced with a cap having an IR transmission reducing surface, according to an embodiment of the present application. The cap 560 is disposed on the post 260 similarly to the sheath 540 with an enclosed end covering the bore 504. The cap 560 includes an internal surface having an internal diameter and an external surface having an external diameter, any or all of which may be IR transmission reducing surfaces 562, for example, matte surface.

It is contemplated that one or more aspects disclosed herein may be combined. Moreover, it is contemplated that one or more aspects disclosed herein may include some or all of the aforementioned benefits. While the foregoing is directed to embodiments of the present disclosure, other and further embodiments of the disclosure may be devised without departing from the basic scope thereof, and the scope thereof is determined by the claims that follow.

What is claimed is:

1. A shaft for supporting a susceptor within an epitaxial growth apparatus, the shaft comprising:
   an infrared transmissive support column;
   a post formed from opaque quartz coaxially coupled with the support column, the post comprising an infrared radiation reducing portion having a lower transmissivity of infrared radiation than the support column, and wherein the thermal expansion coefficient of the post is the same as the support column; and
   a plurality of arms extending radially from the support column and configured to support the susceptor.

2. The shaft according to claim 1, wherein the infrared radiation reducing portion comprises side surfaces of the post.

3. The shaft according to claim 2, wherein the side surfaces of the post comprise a plurality of non-contiguous matte surfaces.

4. The shaft according to claim 2, wherein an entirety of the side surfaces of the post are matte, pebbled or roughened surfaces.

5. The shaft according to claim 1, wherein the infrared radiation reducing portion comprises:
   an attachment having at least one infrared radiation reducing surface, the attachment coupled to the post.

6. The shaft according to claim 5, wherein the attachment has a plate-like shape that comprises at least one infrared radiation reducing surface.

7. The shaft according to claim 6, wherein the attachment has a leg engaging with a bore formed in the post.

8. The shaft according to claim 6, wherein a top surface of the attachment includes both a matte surface and a transparent surface.

9. The shaft according to claim 1, wherein the infrared radiation reducing portion comprises a sheath having infrared radiation reducing surfaces.

10. The shaft according to claim 1, wherein the infrared radiation reducing portion comprises a film deposited on the post.

11. An epitaxial growth apparatus comprising:
   a chamber;
   a susceptor configured to support a semiconductor substrate within the chamber;
   an inner shaft configured to support the susceptor, wherein the inner shaft comprises:
      an infrared transmissive support column;
      a post formed from opaque quartz coaxially coupled with the support column, the post comprising an infrared radiation reducing portion having a lower transmissivity of infrared radiation than the support column, and wherein the thermal expansion coefficient of the post is the same as the support column; and
      a plurality of arms extending radially from the support column and configured to support the susceptor, and
   a plurality of heating units that heat the susceptor and the semiconductor substrate.

12. The epitaxial growth apparatus according to claim 11, wherein the infrared radiation reducing portion comprises side surfaces of the post.

13. The epitaxial growth apparatus according to claim 12, wherein the side surfaces of the post comprise a plurality of non-contiguous matte surfaces.

14. The epitaxial growth apparatus according to claim 12, wherein an entirety of the side surfaces of the post are matte, pebbled or roughened surfaces.

15. The epitaxial growth apparatus according to claim 11, wherein the infrared radiation reducing portion comprises:
   an attachment having at least one infrared radiation reducing surface, the attachment coupled to the post.

16. The epitaxial growth apparatus according to claim 15, wherein the attachment has a plate-like shape that comprises at least one infrared radiation reducing surface.

17. The epitaxial growth apparatus according to claim 16, wherein the attachment has a leg engaging with a bore formed in the post.

18. The epitaxial growth apparatus according to claim 16, wherein a top surface of the attachment comprises both a matte surface and a transparent surface.

19. The epitaxial growth apparatus according to claim 11, wherein the infrared radiation reducing portion comprises a sheath having infrared radiation reducing surfaces.

* * * * *